(12) United States Patent
Gauthier, Jr. et al.

(10) Patent No.: US 6,387,742 B2
(45) Date of Patent: May 14, 2002

(54) THERMAL CONDUCTIVITY ENHANCED SEMICONDUCTOR STRUCTURES AND FABRICATION PROCESSES

(75) Inventors: Robert J. Gauthier, Jr., Hinesburg, VT (US); Dominic J. Schepis, Wappingers Falls, NY (US); William R. Tonti, Essex Junction; Steven H. Voldman, South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/862,451

(22) Filed: May 23, 2001

Related U.S. Application Data

(62) Division of application No. 09/514,106, filed on Feb. 28, 2000, now Pat. No. 6,288,426.

(51) Int. Cl.[7] ................... H01L 21/336; H01L 21/8234; H01L 21/331; H01L 21/8222; H01L 21/76
(52) U.S. Cl. ................. 438/197; 438/294; 438/311; 438/430
(58) Field of Search ................ 438/197, 294, 438/311, 430

(56) References Cited

U.S. PATENT DOCUMENTS

| | | | |
|---|---|---|---|
| 4,402,185 A | | 9/1983 | Perchak |
| 5,040,381 A | | 8/1991 | Hazen |
| 5,229,327 A | | 7/1993 | Farnsworth |
| 5,403,783 A | | 4/1995 | Nakanishi et al. |
| 5,508,740 A | | 4/1996 | Miyaguchi et al. |
| 5,569,621 A | * | 10/1996 | Yallup et al. |
| 5,714,791 A | | 2/1998 | Chi et al. |
| 5,824,561 A | | 10/1998 | Kishi et al. |
| 5,864,158 A | | 1/1999 | Liu et al. |
| 5,877,521 A | * | 3/1999 | Johnson et al. |
| 5,879,980 A | | 3/1999 | Selcuk et al. |
| 6,265,248 B1 | * | 7/2001 | Darmawan et al. |
| 6,306,703 B1 | * | 10/2001 | Noble |
| 6,323,073 B1 | * | 11/2001 | Yeh et al. |

* cited by examiner

Primary Examiner—John F. Niebling
Assistant Examiner—Josetta I. Jones
(74) Attorney, Agent, or Firm—Whitham, Curtis & Christofferson, P.C.; Eugene I. Shkurko

(57) ABSTRACT

Silicon is formed at selected locations on a substrate during fabrication of selected electronic components. A dielectric separation region is formed within the top silicon layer, and filled with a thermally conductive material. A liner material may be optionally deposited prior to depositing the thermally conductive material. In a second embodiment, a horizontal layer of thermally conductive material is also deposited in an oxide layer or bulk silicon layer below the top layer of silicon.

26 Claims, 14 Drawing Sheets

US 6,387,742 B2

THERMAL CONDUCTIVITY ENHANCED SEMICONDUCTOR STRUCTURES AND FABRICATION PROCESSES

This application is a division of U.S. patent application Ser. No. 09/514,106 filed Feb. 28, 2000 now U.S. Pat. No. 6,288,426.

BACKGROUND OF THE INVENTION

1. Field of the Invention

The present invention generally relates to heat dissipation in semiconductor devices and, more particularly, to a structure and fabrication process which provides one or more thermally conducting studs in a semiconductor device to dissipate heat therefrom.

2. Background Description

Thermal conduction and heat dissipation is of great need in semiconductor devices due to the presence of the thermal heating from self heating of semiconductor components.

U.S. Pat. No. 5,714,791, issued to Chi et al. and entitled "On-chip Peltier Cooling Devices on a Micromachined Membrane Structure" discloses a Peltier cooling device generally useful in cooling electronic devices, especially those which are formed of high Tc superconducting materials. The Peltier device is formed on a micromachined membrane structure to assure good thermal isolation and to intimately integrate the cooling device with the electronic device it is to cool. The membrane is formed by selective, controlled etching of a bulk substrate of a material such as silicon. The Peltier device is formed by selectively implanting or depositing appropriate dopants to form n-doped and p-doped segments on the membrane with a junction between the differently doped segments at the approximate mid-point of the membrane.

U.S. Pat. No. 5,508,740, issued to Miyaguchi et al. and entitled "Solid-State Imaging Device Having Temperature Sensor" discloses a solid state image sensor that comprises a chip in a package. An image sensor is formed in the chip. The package has a main body, a light receiving glass plate fixed to the main body, and a buffer member arranged between the main body and light receiving glass plate. The buffer member is fixed to the light receiving glass plate and to the main body. The thermal expansion coefficient of the buffer member is substantially equal to that of the light receiving glass plate, so that the light receiving plate is fixed to the main body even though the temperature of the imaging device changes. Therefore, the adhesion is maintained between the main body and the light receiving glass plate and the airtightness in the package.

U.S. Pat. No. 5,403,783, issued to Nakanishi et al. and entitled "Integrated Circuit Substrate With Cooling Accelerator Substrate" discloses an electronic device that includes an integrated circuit device, comprising a first substrate including an integrated electronic semiconductor circuit and a second substrate including a cooling accelerator for accelerating a heat energy exchange between the integrated electronic semiconductor circuit and a cooling fluid.

U.S. Pat. No. 5,229,327, issued to Farnworth and entitled "Process for Manufacturing Semiconductor Device Structures Cooled by Peltier Junctions and Electrical Interconnect Assemblies Therefor" discloses a method for utilizing a single series operating current for providing operating power to an electronic device while simultaneously increasing or decreasing the cooling in a manner directly proportional to increases and decreases in power consumption and heat dissipation from the electronic device. The electronic device is connected to a first power supply terminal and a Peltier cooling junction is connected to one side of the electronic device. A Peltier heating junction is connected to one side of the Peltier cooling junction remote from the electronic device, and a heat sink is connected between the Peltier heating junction and a second power supply terminal. In this manner, a single series electrical circuit may be used for simultaneously providing operating power to the electronic device and cooling the electronic device in proportion to heat dissipation requirements therefor. Advantageously, the Peltier cooling and heating junctions may be formed in a planar fashion on the surface of a semiconductor die and used to cool integrated circuits which are fabricated within the die.

U.S. Pat. No. 5,040,381, issued to Hazen and entitled "Apparatus for Cooling Circuits" discloses an apparatus for cooling circuit modules by use of a thermo-electric device which comprises a series of semiconductor regions and etched copper conductors designed to conduct heat in a specified direction by means of the Peltier effect. The thermo-electric device is sandwiched between two layers of a polymer based, thermally conductive dielectric such as the dielectric used in the manufacture of Thermal Clad™. The hot layer of Thermal Clad™ (i.e., the layer that receives heat) is laminated directly to a heat sink. The cold layer of Thermal Clad™ is laminated directly to a cold plate which is, in turn, coupled to the circuit module.

SUMMARY OF THE INVENTION

It is therefore an object of the present invention to provide a structure and fabrication process which provides for improved heat dissipation in semiconductor devices.

It is a further object of the invention to provide a structure and fabrication process which provides semiconductor elements with improved electrostatic discharge (ESD) robustness.

A first set of structures places a thermally conductive stud inside an isolation structure. It is preferred that the isolation structure is a single depth shallow trench isolation or a dual-depth trench isolation region. In general, the method of the present invention is suitable for trench isolation processes known in the art (e.g., dual depth).

An opening is formed in a shallow trench isolation (STI) region. An etch, preferably a reaction ion etch (RIE), forms a trough, which can extend either to a buried oxide (BOX) layer, or to the bulk silicon. The trough is optionally filled with a relatively thin layer of liner material, and then filled with a thermally conductive material, which is preferably polished so that it is substantially coplanar with a top surface of the structure. It is preferred that the thermally conductive material be one of heavily doped silicon, polysilicon, aluminum, copper, tungsten, refractory metals, or titanium, although other materials may also be used. Formation of the thermally conductive stud can be performed either early in the semiconductor process or in the Back End of Line (BEOL). It is preferred that the thermally conductive stud be placed within three thermal diffusion lengths of heat generating devices (HGDs) (e.g., metal oxide semiconductor field effect transistors (MOSFETs), bipolar devices, diodes, and, if desired, even interconnects).

A second set of structures comprises a first thermally conductive stud in the BOX layer, and a second thermally conductive stud in the isolation structure as described above with regard to the first embodiment. The first thermal stud may either be inactive or, in conjunction with the BOX layer and the HGD, form a buried gate structure of a dual gate SOI structure. The first thermal stud, in conjunction with the second thermal stud, allows both lateral and vertical thermal heat transport to the top surface and to the bulk substrate.

Both the first and second structures can either be capped or uncapped. The thermally conductive region (e.g., the area from which heat is conducted) can extend either to the buried oxide to the bulk substrate. It is also preferred in the second embodiment, as in the first embodiment, that the thermally conductive studs be positioned within three thermal diffusion lengths of any HGDs.

In contrast to the prior art references that utilize Peltier devices, the present invention provides a system and method that passively provides for heat dissipation in integrated circuit chips. In further contrast to the prior art references, the present invention integrates thermal heat transfer structures into a dual-gate silicon on insulator (SOI) technology, thereby providing a heat dissipation in dual-gate SOI technology.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
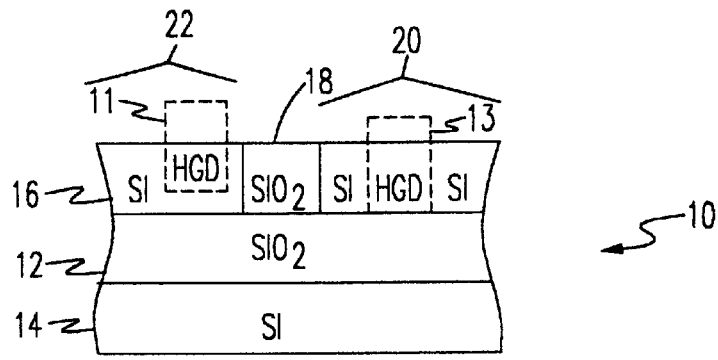
FIGS. 1a–1d are sequential cross-sectional views of process steps according to a first embodiment of the invention for producing a thermal conductivity enhanced SOI.

FIGS. 1a–1d illustrate one embodiment of a fabrication process according to this invention. Starting with a substrate such as a wafer 10 having, as shown in FIG. 1a, a BOX layer 12 separating bulk substrate 14 and a surface silicon film 16, a dielectric isolation 18, such as a trench isolation or a MESA isolation is formed on the BOX layer 12 to separate and isolate regions 20 and 22. The wafer 10 is representative of starting materials for silicon on insulator (SOI) and silicon on silicon (SOS) devices well known in the art, and the isolation structure 18 can be created by any number of well-known techniques and serves the purpose of providing structures 20 and 22 on the wafer 10. The BOX layer 12 is present for the silicon on insulator technology. It should be readily understood to those skilled in the art that the present invention is not limited to SOI devices. In fact, the invention can be equally practiced with silicon-on-silicon devices.

FIG. 1a shows structures 20 and 22 for illustrative purposes, and it should be understood by those of skill in the art that the wafer 10 will have several isolated structures 20 and 22 on its surface, each being separated by dielectric region 18. HGDs 11, 13 are placed in the isolated structures 20, 22. It will also be readily apparent to those skilled in the art that isolation structures 20, 22 can each contain more than one HGD. Further, those skilled in the art will recognize that HGD 13 is a fully depleted HGD, where the junctions of HGD 13 contact the top surface of BOX layer 12, and that HGD 11 is a partially depleted HGD, where the junctions thereof do not contact the top surface of BOX layer 11. Isolation structures 20, 22 may also be ultra thin SOI structures.

In general, the invention is not intended to be limited to any type of HGD. Typical HGDs that may be used with the present invention include, but are not limited to, single- and double-gate SOI MOSFETs, SOI capacitors and gated resistors, and gated and ungated SOI resistors with salicide block mask. Representative HGDs are shown in FIGS. 3 to 11.

Figure 1B:
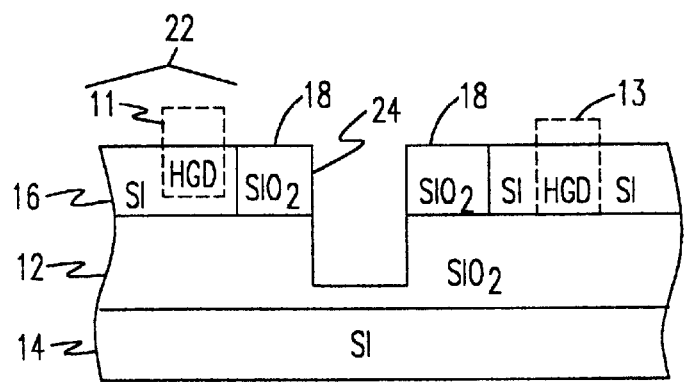

FIG. 1b shows the resulting structure after the isolation structure 18 and the buried oxide layer 12 are etched. The resulting trough 24 is formed preferably by a reaction ion etch (RIE) through a mask (not shown) formed by photolithography. In this embodiment, the etching extends to the oxide layer 12. The etching could optionally extend to bulk silicon layer 14.

Figure 1C:
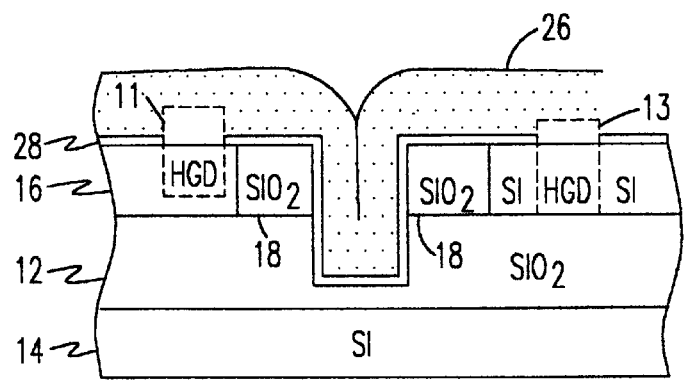

FIG. 1c shows that the trough 24 is filled with a thermally conductive material 26 to form what will become a thermal stud. The preferred thermally conductive materials 26 include, but are not limited to, heavily doped silicon, polysilicon, aluminum, copper, tungsten, refractory metals, and titanium. The heavily doped silicon should be doped at least $10^{18}$ atoms/cm$^3$. The choice of conductive material is largely dependent on the hot process steps of integration, and the adhesive properties of the material. The trough 24 may also be optionally filled with a liner material 28 prior to depositing the material 26. The liner material 28 serves as a diffusion barrier. Particular liner materials may be selected for their adhesive properties, as well as electromigration considerations. It is thus preferred, but not required, that liner materials be selected from the refractory metal group (e.g. titanium, tantulum, tungsten, etc.).

Figure 1D:
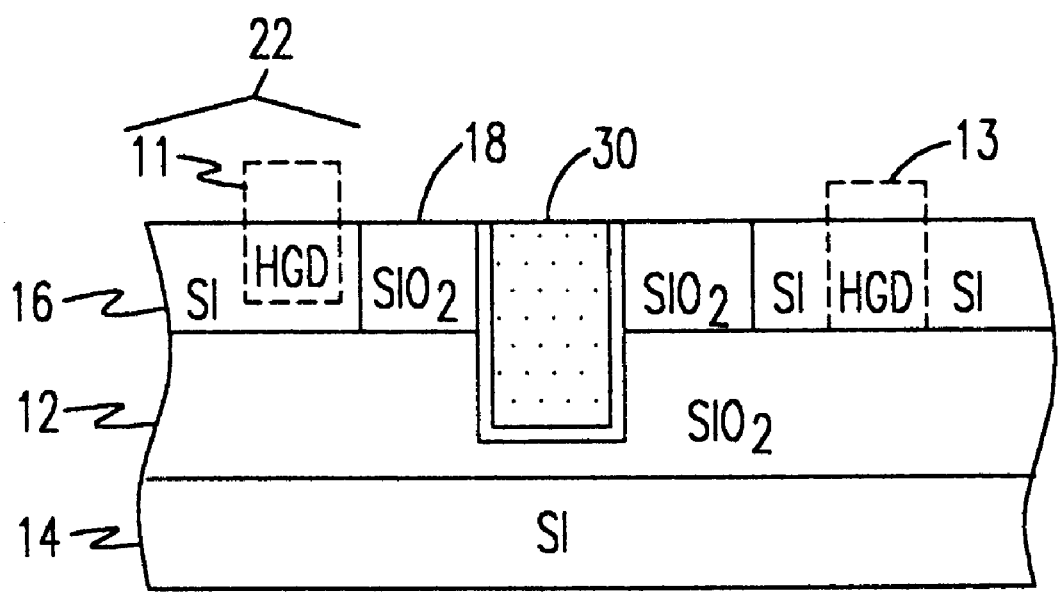

FIG. 1d shows the resulting structure after the thermally conductive material 26 is polished, which results in the thermal stud 30. The formation of the thermal stud 30 can be performed either early in the semiconductor process or in the BEOL. The thermal stud 30 can terminate anywhere within the silicon dioxide 12, as shown in FIG. 1d, or within the bulk silicon substrate layer 14. This structure can be capped (e.g. filled with an insulator material and polished) or uncapped.

It should be understood that thermal stud 30 is inactive; it is not connected to and HGDs in the substrate 16. Therefore, the function of HGD 30 is to dissipate heat.

It should also be understood that HGDs 11, 13 can be positioned in any x, y, z direction and distance relative to thermal stud 30. Thus, for example, as will be understood to those skilled in the art, HGDs 11 and/or 13 may be located out of the plane with respect to thermal stud 30. However, to maximize heat dissipation, it is preferred, but not required, that the HGDs 11 and 13 be located within three thermal diffusion lengths of thermal stud 30.

Figure 1E:
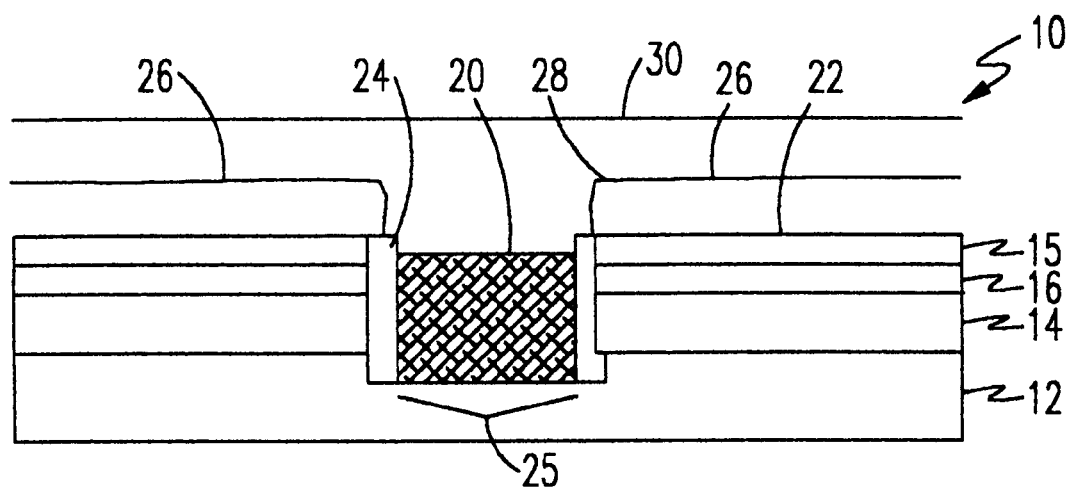
FIG. 1e is a cross-sectional view of a variant for of the structure providing a connection to the back side bulk silicon and of improved thermal performance.

In the SOI structure 10 shown in FIG. 1e, a resist layer 26 is applied over the ILD (inter layer dielectric) layer 18 or the polish stop layer 22, if used, and lithographic exposure and development performed to pattern the resist as indicated at 28. The SOI structure is then etched by any of a plurality of processes well-known to those skilled in the art to provide a recess in the SOI structure to the bulk silicon layer 12. Etching into the bulk silicon is performed as a timed etch after a returned detection signal (e.g. a change in the optical spectrum with change of etched material) changes from the ILD to the bulk silicon. The timed etch can be optimized to increase the surface area of the interface between the bulk silicon and the thermal plug 20. A thin insulator layer 24 is then isotropically deposited or, preferably, thermally grown within the recess. A spacer etch process may then be optionally applied to remove the oxide at the bottom of the recess as indicated at 25, allowing direct contact of the bottom of the thermal plug 20 with the back side bulk silicon as shown in FIG. 1e. This may be performed by a masked or unmasked process depending upon the selectivity of the etch between the materials of layer 22 and 24. In the preferred embodiment of the invention, relatively great selectivity is available between nitride and oxide with processes well-understood in the art.

A polysilicon layer of sufficient thickness to fill the recess is then deposited and patterned by polishing back to the polish stop layer 22 or ILD layer 18 which also serves to planarize the surface of the structure. The polish stop layer 22 may then be removed or patterned as dictated by further processing to form active devices in and/or on active layer 16 surrounding (e.g. to the right and left in FIG. 1) of thermal plug 20. After the active devices are formed, insulator or passivation layers 30 may be applied and opened where necessary for formation of connections to the active devices.

It should be noted that the thermal plug so formed has substantial lateral area within silicon active layer 16 and ILD layer 18 in front and behind the plane of the page of FIG. 1e. Further, the thin insulator 24, particularly if thermally grown, can be limited to a thickness of a few hundred Angstroms or less only sufficient to maintain electrical isolation between the silicon active layer 16 and the bulk silicon substrate 12 and is thus only a very small fraction of the thickness of insulator layer 14. Therefore, a heat transfer path of low thermal resistance is formed between the silicon active layer 16 and the bulk silicon substrate 12, effectively shunting the high thermal resistance path through thick insulator layer 14. The low thermal resistance of this path may be enhanced by optimization of the area of the thermal plug/bulk silicon interface, minimizing the thickness of sidewall insulator 24 and/or removal of the insulator at the bottom of the thermal plug.

Figure 1F:
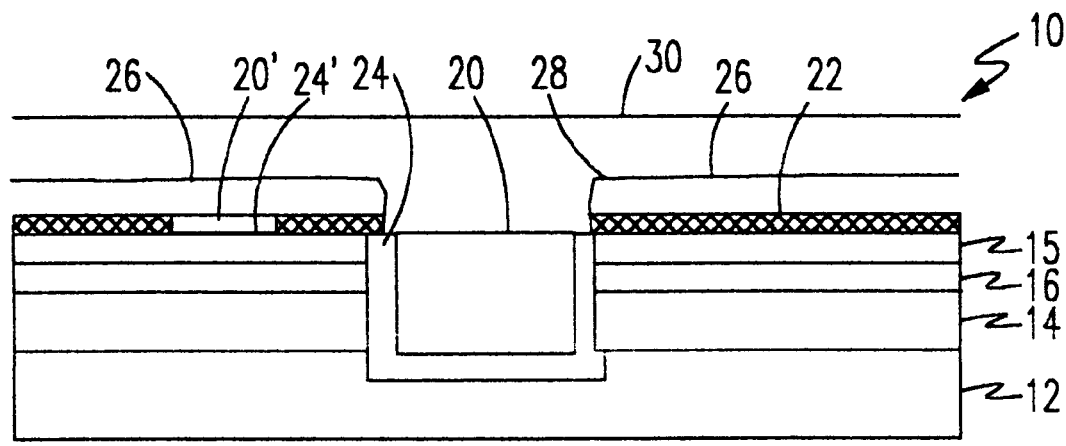
FIG. 1f is a cross-sectional view of another embodiment of the invention.

Referring now to FIG. 1f, formation of a another embodiment of the invention will now be described. Specifically, starting with an SOI wafer 12, 14, 16 as before, a layer of silicon nitride 22 is deposited to a thickness approximating the desired final thickness of the gate polysilicon of an active device, generally in the range of 500 to 3000 Angstroms (which is large relative to gate insulator thickness). A photoresist mask layer 26 is then deposited and patterned with openings only at the locations of the thermal plug 20. The nitride layer and wafer are then etched to the back side bulk silicon, as before. The resist is then removed and another resist mask formed with openings at the gate active regions and the nitride layer is etched through to the SOI wafer surface of the active silicon layer.

An insulator (generally oxide) 24' is then deposited or preferably grown to the thickness desired for the gate insulator to simultaneously form the gate insulator and the insulator layer within the thermal plug openings. (If it is desired to open the insulator at the bottoms of the thermal plug openings as in FIG. 1e, another mask and etch process must be performed at this point.) Then polysilicon 20, 20' is deposited to fill the thermal plug openings which also fills the remainder of the gate openings in the nitride layer. The polysilicon layer is then planarized (e.g. by polishing to the nitride layer) to complete the structure shown in FIG. 1f and establish the thickness of the gate polysilicon in accordance with the thickness of the nitride layer polish stop (e.g. the thickness of the nitride layer less the thickness of the gate insulator).

Figure 2A:
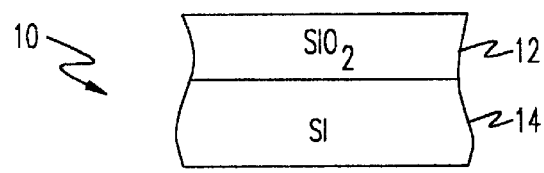
FIGS. 2a–2i are sequential cross-sectional views of process steps according to a second embodiment of the invention for producing a thermal conductivity enhanced SOI.
Figure 2B:
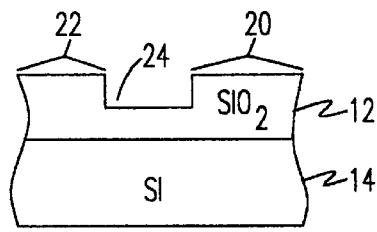
Figure 2C:
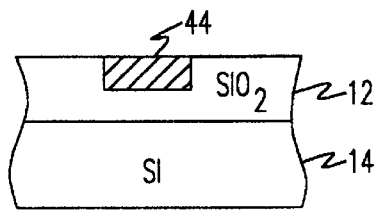
Figure 2D:
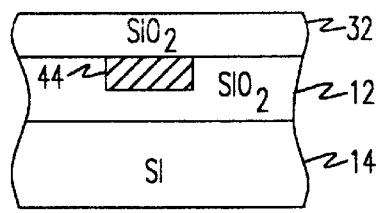
Figure 2E:
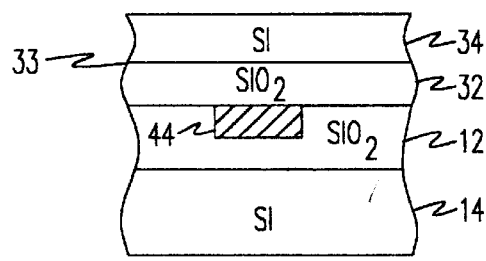
Figure 2F:
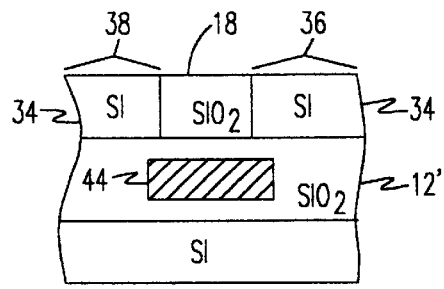
Figure 2G:
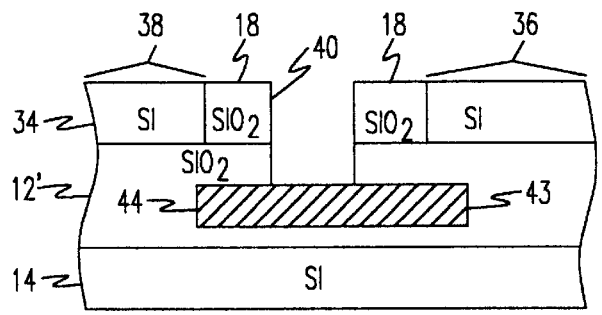
Figure 2H:
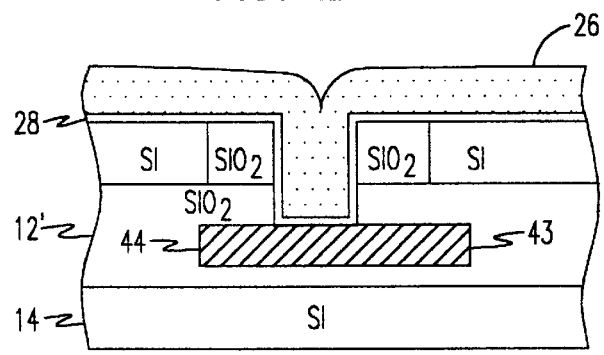
Figure 2I:
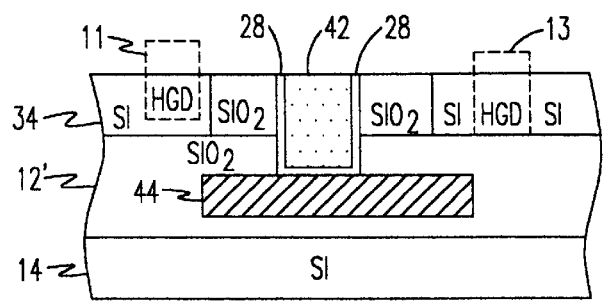

In a second embodiment of the invention, a preferred final structure of which is shown in FIG. 2i, a first thermal stud 26 is provided in BOX layer 12' (comprised of oxide layers 12 and 32). In the preferred embodiment, first thermal stud 44 will contact second thermal stud 42 in order to maximize heat dissipation. However, depending on design considerations, the invention may also be practiced with studs 44 and 42 not being in contact with each other.

In this embodiment, thermal stud 44 may, if desired, have a functional application. For example, those skilled in the art will recognize that thermal stud 44 can be a buried gate structure where HGD 11 and/or 13 is a dual gate SOI gated structure. Thermal stud 44 may also, of course, be a buried film with no functional applications. Thermal stud 44 allows both lateral and vertical thermal heat transport either to the top surface of dielectric isolation 18 or to the bulk substrate 14. This structure can also be capped or uncapped.

FIG. 2a shows the initial step of the process where an oxide layer 12 is deposited on bulk substrate 14. The wafer 10 is again representative of starting materials for fabricating integrated that are well known in the art. In FIG. 2a, the wafer 10 is masked and etched to define a trough 24, which can be created by any number of well-known techniques and serves the purpose of providing structures 20 and 22 on the wafer 10.

In FIG. 2c, thermal stud 44 is formed by filling trough 24 with a thermally conductive material. It is preferred that the material again be one of heavily doped silicon, polysilicon, aluminum, copper, tungsten, refractory metals, or titanium, although other materials may also be used. The heavily doped silicon should be doped at least $10^{18}$ atoms/cm$^3$. The thermally conductive material is then polished to form thermal stud 44, which has a surface that is substantially coplanar with oxide layer 12. It should be understood by those of skill in the art that the wafer 10 may have several thermal studs 44.

In step 2d, another layer of oxide 32 is deposited over oxide layer 12 and the thermal stud 44. Oxide layer 32 may also be spun on in accordance with known techniques.

In FIG. 2e, a second layer of silicon 34 is bonded to oxide layer 32. A portion of second layer of silicon 34, corresponding to dielectric isolation 18 shown in FIG. 2f, is then either "snapped", or etched to the top surface 33 of oxide layer 32. Snapping is well known in the art, and is typically done by first implanting hydrogen to weaken oxide layer 32. After the second layer of silicon 34 is bonded to oxide layer 32, a portion of second layer 34 is "cracked" off to form a trough in which dielectric isolation region 18 is formed, as shown in FIG. 2f. If desired, a water jet, or other known techniques can also be used to initiate the splitting of second layer 34.

In FIG. 2f, a dielectric isolation 18, such as a trench isolation or a MESA isolation is formed in the silicon layer 34 to separate regions 36 and 38. FIG. 2f shows structures 36 and 38 for illustrative purposes, and it should be understood by those of skill in the art that the wafer 10 will have several isolated structures 36 and 38 its surface, each being separated by dielectric region 18.

FIG. 2g shows the resulting structure after a portion of the isolation structure 18 is etched. The trough 40 is formed preferably by a reaction ion etch (RIE), although other etching techniques may also be used. In this embodiment, the etching is to the top surface 43 of thermal stud 44.

FIG. 2h shows that the trough 40 is filled with additional thermally conductive material 26 to form what will become a thermal stud 42, as shown in FIG. 2i. It should be understood that, depending upon design considerations, it is not necessary that the thermal studs 42 and 44 comprise the same thermally conductive material. For example, copper may be used for thermal stud 42, and tungsten may be used for thermal stud 44. Other combinations, of course, may also be used. As shown in FIG. 2i, the trough 40 may also be optionally filled with a liner material 28 prior to forming thermal stud 42. It is preferred that the thermally conductive material be one of a selective silicon, polysilicon, aluminum, copper, tungsten, refractory metals, or titanium, although other materials may also be used.

FIG. 2i shows the resulting structure after the thermally conductive material 26 is polished, which results in the thermal stud 42. The formation of the thermal stud 42 can be performed either early in the semiconductor process or in the BEOL. The thermal stud 42 can terminate anywhere within the silicon dioxide 12. In a preferred embodiment, thermal stud 42 should directly contact thermal stud 44 in a liner material 28 is not used; when liner material 28 is used, it should directly contact thermal studs 24 and 44.

It should also be understood that HGDs 11, 13 can be positioned in any x, y, z direction and distance relative to thermal studs 42 and 44. Thus, for example, as will be understood to those skilled in the art, HGDs 11 and/or 13 may be located out of the plane with respect to thermal stud 42 and 44. However, to maximize heat dissipation, it is preferred that the HGDs 11 and 13 be located within three thermal diffusion lengths of thermal studs 42 and 44.

Figure 3:
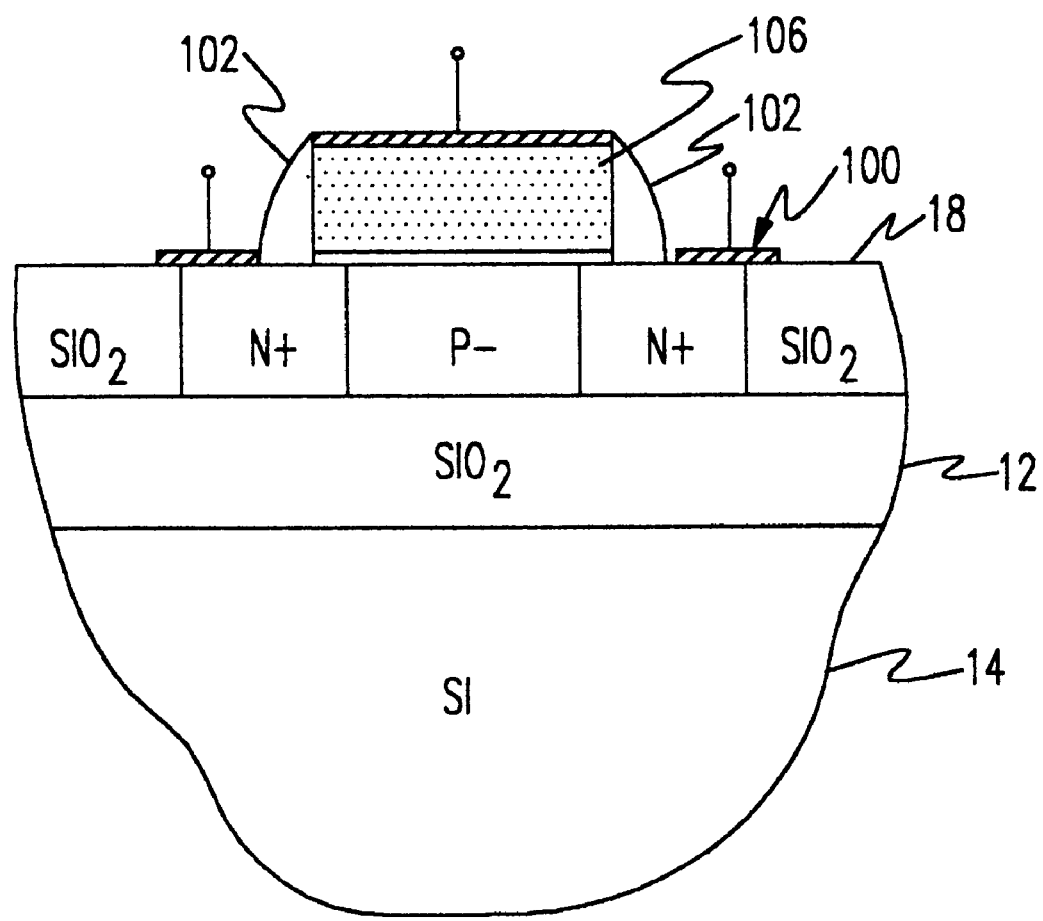
FIG. 3 is a representative single gate MOSFET.

FIG. 3 is a representative single gate MOSFET 100, having a polysilicon film 106 deposited thereon, and spacers 102 contacting the polysilicon film 106. The insulator 18, BOX 12, and substrate 14 are shown as in FIG. 1.

Figure 4:
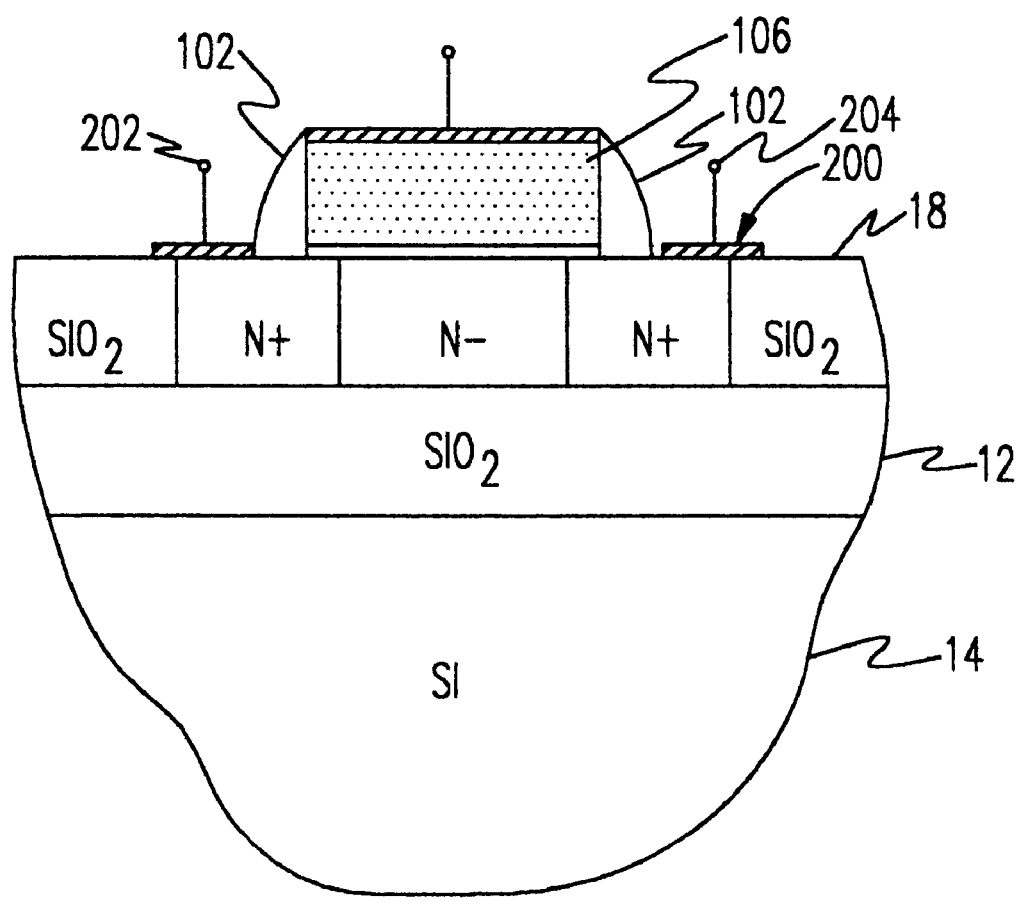
FIG. 4 is a representative SOI capacitor (or gated resistor)

FIG. 4 shows a representative SOI capacitor (or gated resistor) 200, having a polysilicon film 106 deposited thereon, spacers 102 contacting the polysilicon film 106, and first (104) and second (102) electrodes 1. The insulator 18, BOX 12, and substrate 14 are shown as in FIG. 1.

Figure 5:
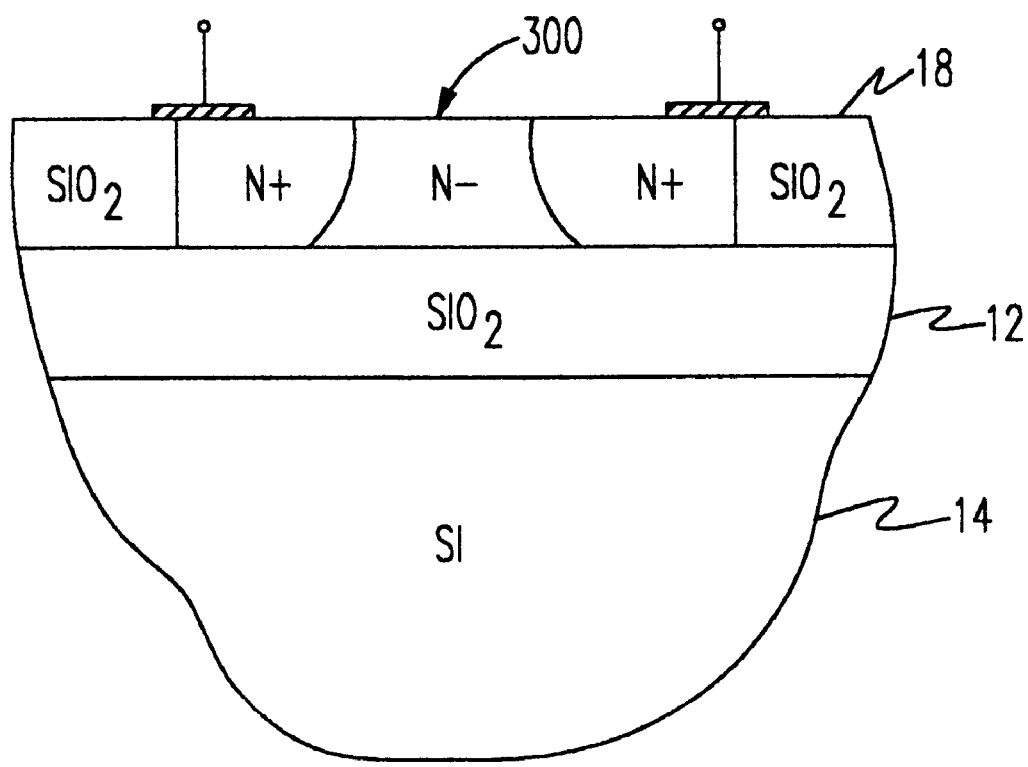
FIG. 5 is a representative SOI resistor (ungated with salicide black mask)

FIG. 5 shows a representative SOI resistor (ungated with salicide black mask) 300. The insulator 18, BOX 12, and substrate 14 are shown as in FIG. 1.

Figure 6:
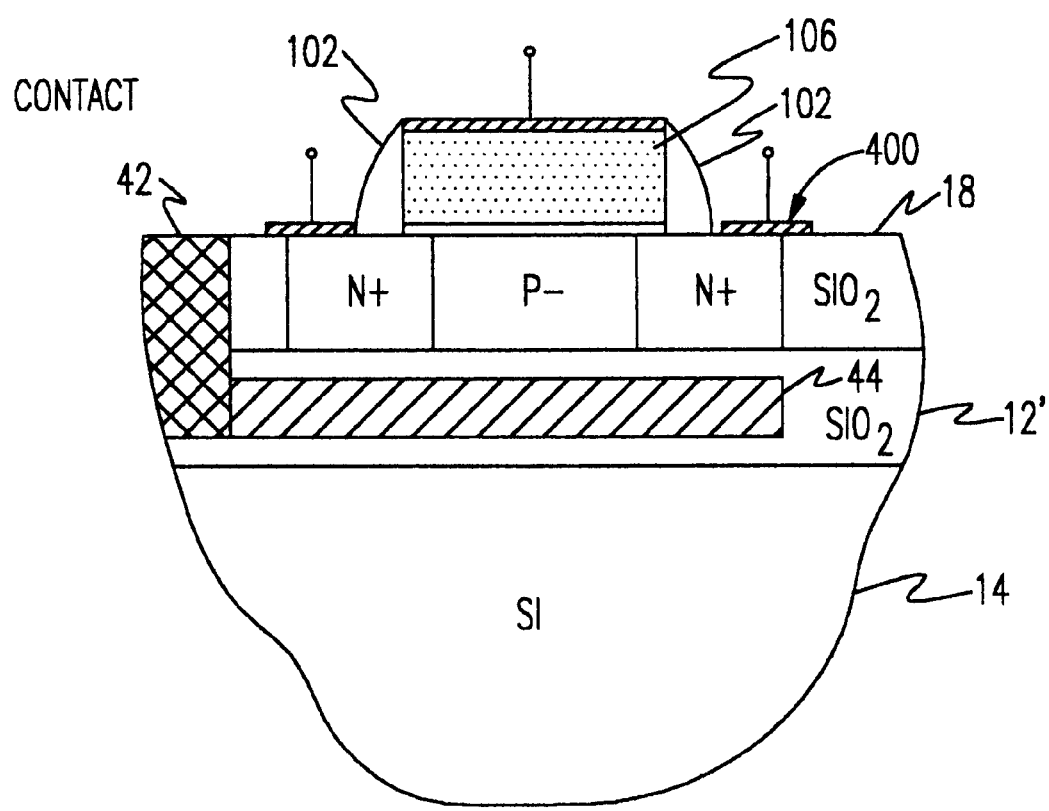
FIG. 6 is a representative single gate/double gate SOI MOSFET.

FIG. 6 is a representative single gate/double gate SOI MOSFET 600, having a polysilicon film 106 deposited thereon, and spacers 102 contacting the polysilicon film 106. The insulator 18, BOX 12', substrate 14, first thermally conducting material 44, and second thermally conducting material 42 are shown as in FIG. 2.

Figure 7:
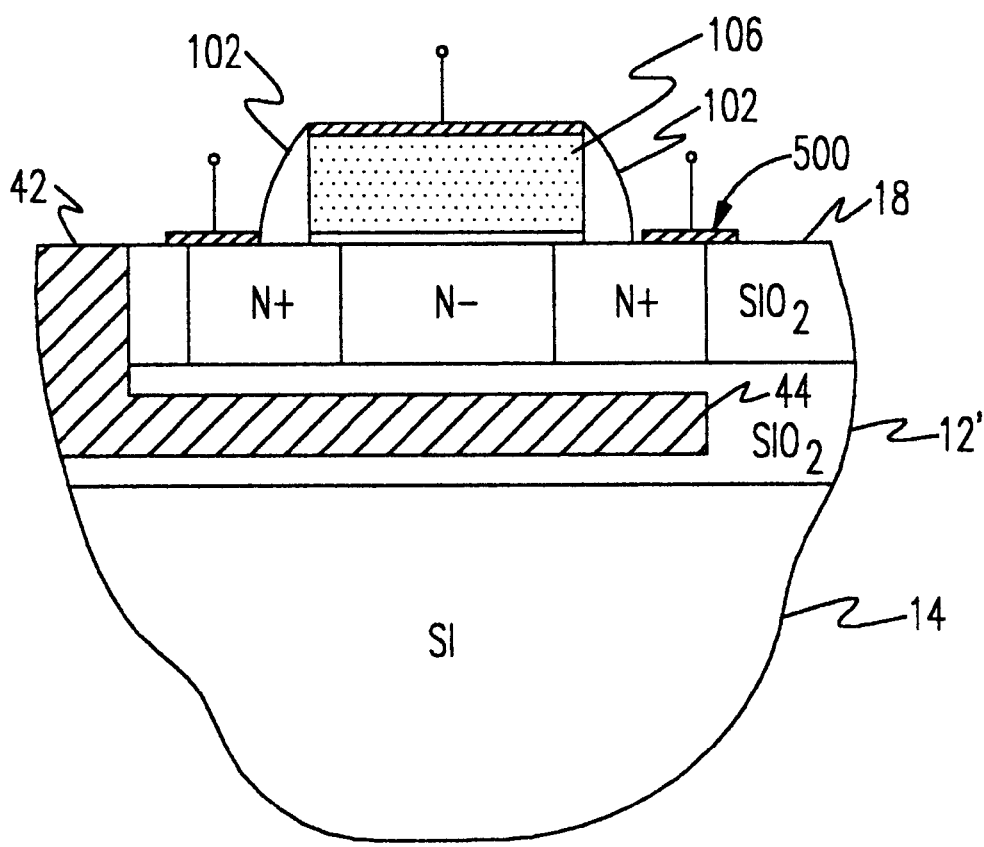
FIG. 7 is a representative SOI capacitor (or gated resistor)

FIG. 7 is a representative SOI capacitor (or gated resistor) 500, having a polysilicon film 106 deposited thereon, and spacers 102 contacting the polysilicon film 106. The insulator 18, BOX 12', substrate 14, first thermally conducting material 44, and second thermally conducting material 42 are shown as in FIG. 2.

Figure 8:
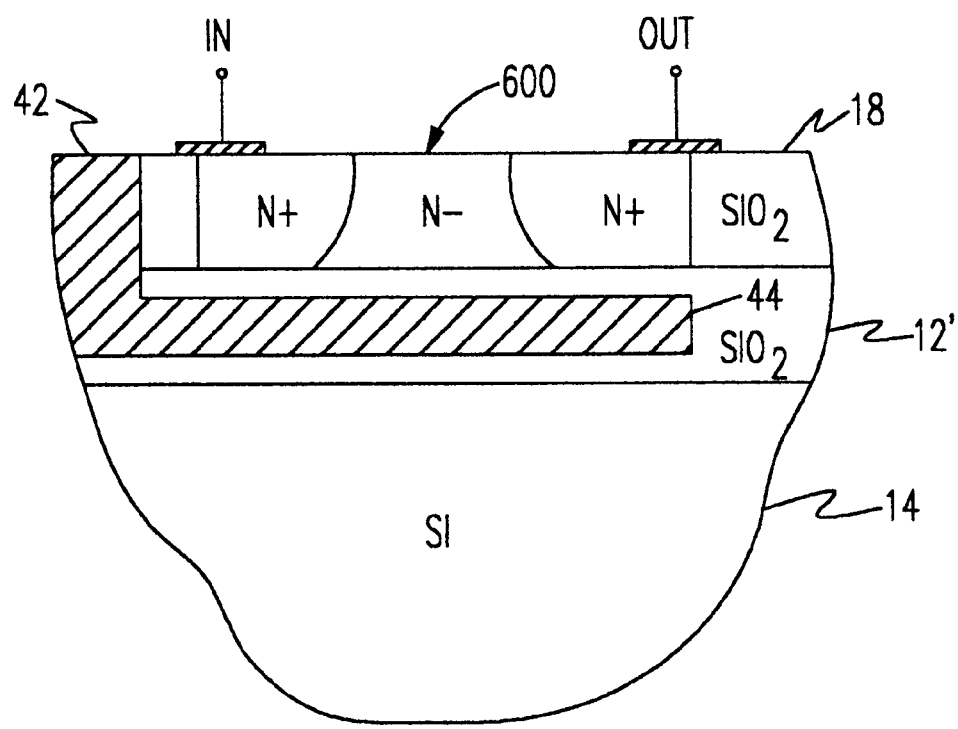
FIG. 8 is a representative SOI resistor (ungated with salicide block mask)

FIG. 8 is a representative SOI resistor (ungated with salicide block mask) 600. The insulator 18, BOX 12', substrate 14, first thermally conducting material 44, and second thermally conducting material 42 are shown as in FIG. 2.

Figure 9:
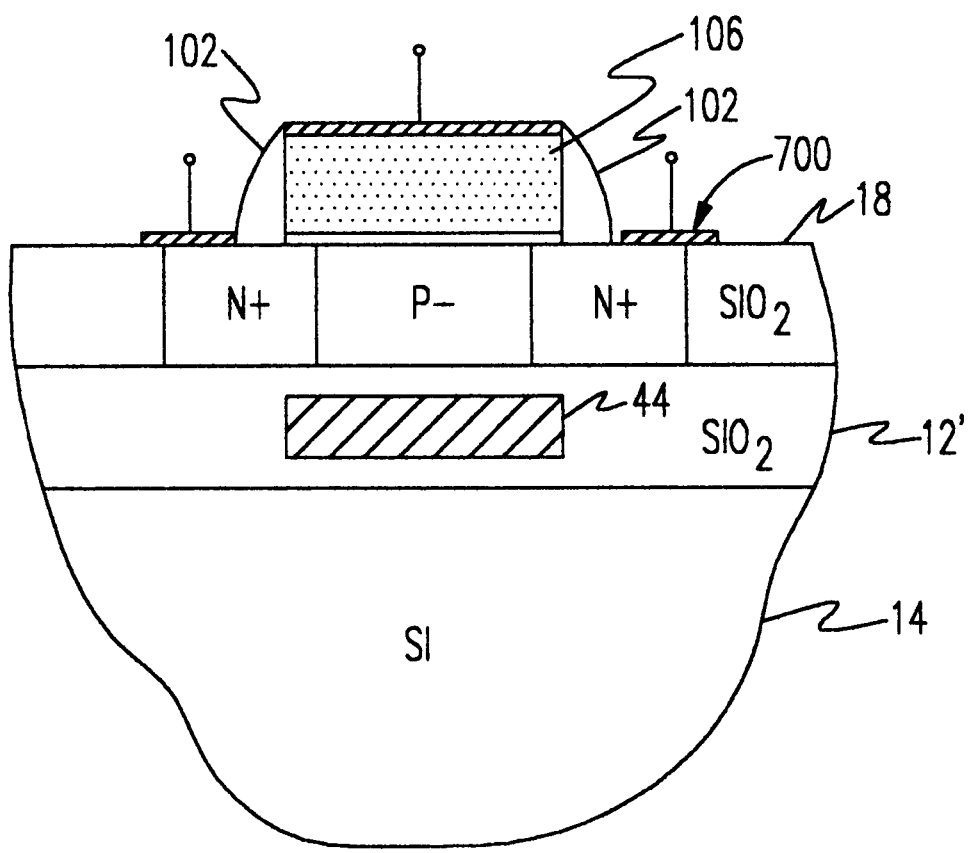
FIG. 9 is a representative double gate SOI MOSFET with thermal sink (contact out of the plane)

FIG. 9 is a representative double gate SOI MOSFET with thermal sink (contact out of the plane) 700. The insulator 18, BOX 12', substrate 14, and first thermally conducting material 44 are shown as in FIG. 2.

Figure 10:
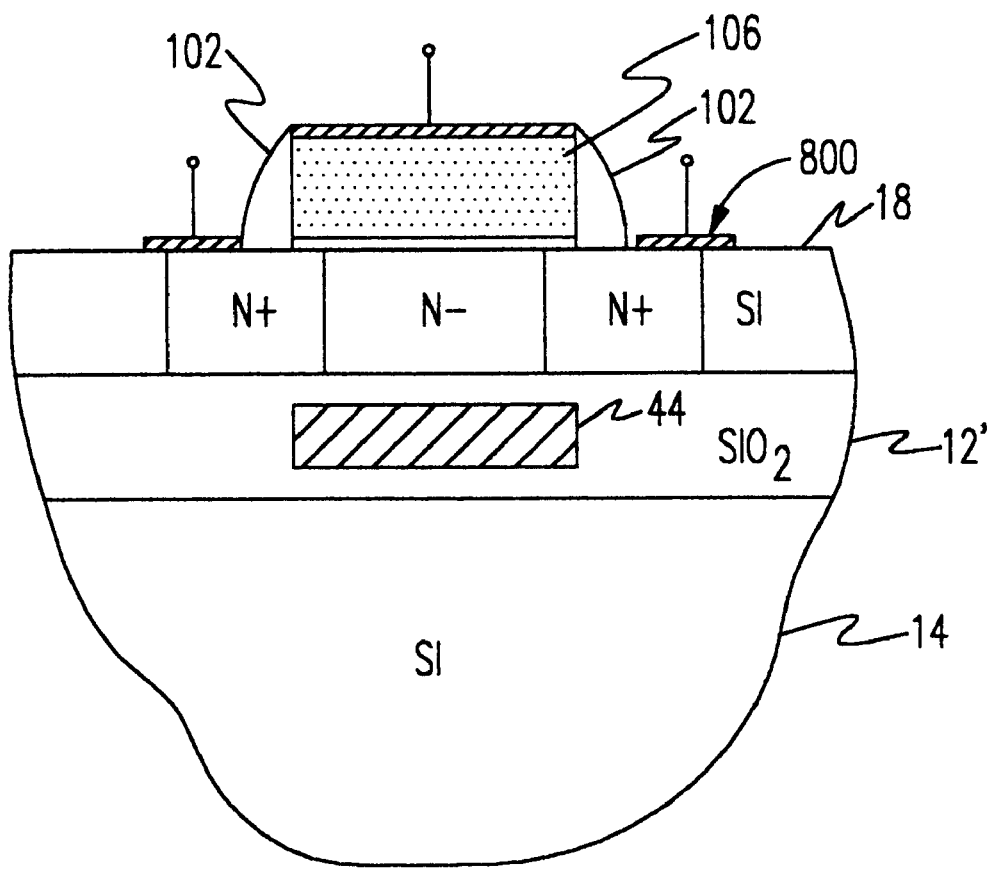
FIG. 10 is a representative SOI capacitor (or gated resistor) with thermal sink (contact out of the plane)

FIG. 10 is a representative SOI capacitor (or gated resistor) with thermal sink (contact out of the plane) 800 having a polysilicon film 106 deposited thereon, and spacers 102 contacting the polysilicon film 106. The insulator 18, BOX 12', substrate 14, and first thermally conducting material 44 are shown as in FIG. 2.

Figure 11:
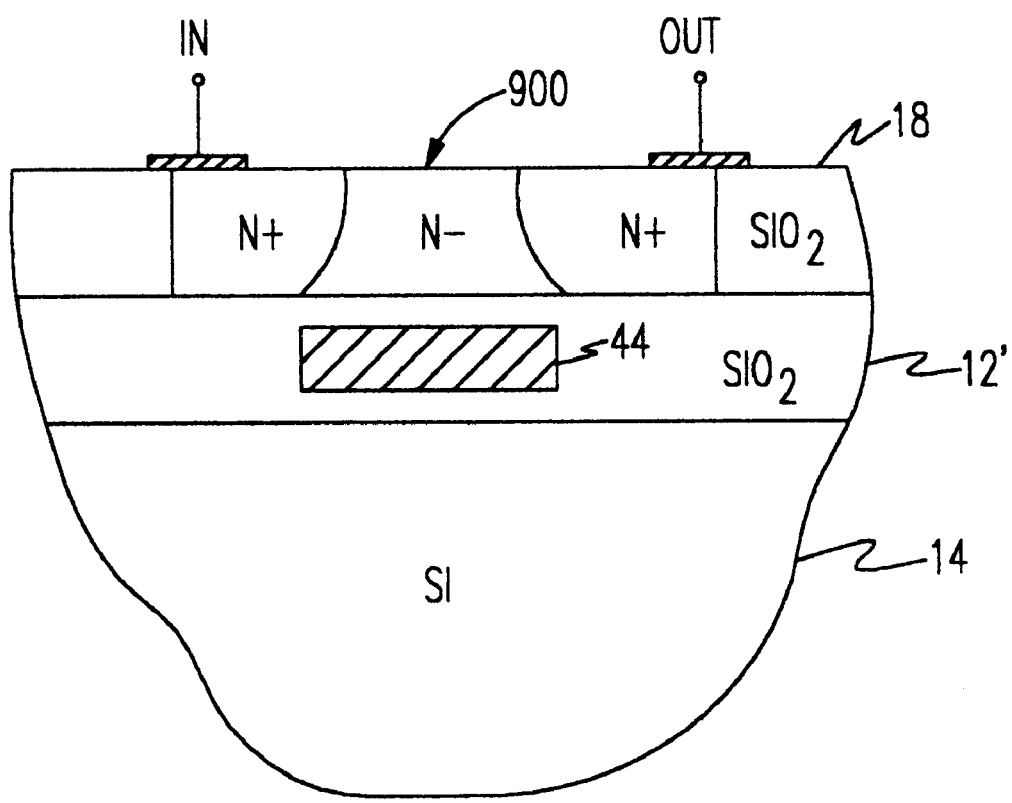
FIG. 11 is a representative SOI resistor (ungated with salicide block mask, with contact out of the plane).

FIG. 11 is a representative SOI resistor (ungated with salicide block mask, with contact out of the plane) 900. The insulator 18, BOX 12', substrate 14, and first thermally conducting material 44 are shown as in FIG. 2.

While the invention has been described in terms of two preferred embodiment, those skilled in the art will recognize that the invention can be practiced with modification within the spirit and scope of the appended claims.

Having thus described our invention, what we claim as new and desire to secure by Letters Patent is as follows:

1. A method for fabricating a semiconductor structure, comprising the steps of:

isolating regions of surface silicon of a substrate comprised of bulk silicon and surface silicon separated by an insulator to produce at least first and second regions of surface silicon separated by an isolation region having a top surface that is substantially coplanar with a top surface of the at least first and second regions and which extends to the insulator;

applying a mask pattern to a surface of the isolation region, the mask pattern having openings which expose at least a portion of the isolation region;

adding a thermally conductive material used for heat dissipation only to the isolation region at openings defined in the mask pattern such that a top surface of the thermally conductive material is substantially coplanar with the top surface of the first and second regions; and removing the mask pattern.

2. The method as recited in claim 1, wherein the thermally conductive material is added between adjacent heat generating devices.

3. The method as recited in claim 2, wherein the heat generating devices are located within three thermal diffusion lengths of the thermally conductive material.

4. The method as recited in claim 1, wherein the heat generating devices are fully depleted.

5. The method as recited in claim 1, wherein the heat generating devices are partially depleted.

6. The method as recited in claim 1, wherein the heat generating devices are located within three thermal diffusion lengths of the thermally conductive material.

7. The method as recited in claim 1, further comprising the step of adding a liner material within the isolation region that contacts the buried oxide.

8. The method as recited in claim 1, further comprising the step of adding a liner material within the trench isolation region that contacts the bulk silicon and the buried oxide.

9. The method as recited in claim 1, wherein the isolation region is a trench isolation.

10. The method as recited in claim 1, wherein the isolation region is a MESA isolation.

11. A method for fabricating a semiconductor structure, comprising the steps of:

forming a trough within a first insulator layer formed on a layer of bulk silicon to produce at least first and second regions of the insulator;

depositing in the trough a first thermally conductive material having a top surface that is substantially coplanar with a top surface of the at least first and second regions;

depositing a second insulator layer on the first insulator layer and the first thermally conductive material;

depositing a layer of surface silicon over the second insulator layer;

isolating regions of the surface silicon to produce at least first and second regions of surface silicon separated by an isolation region having a top surface that is substantially coplanar with a top surface of the at least first and second regions of the surface silicon;

applying a mask pattern to a surface of the isolation region, the mask pattern having openings which expose at least a portion of the isolation region;

etching an opening within the isolation region;

depositing a second thermally conductive material used for heat dissipation only in the opening such that a top surface of the second thermally conductive material is substantially coplanar with a top surface of the first and second regions of the surface silicon; and removing the mask pattern.

12. The method as recited in claim 11, wherein a portion of the second thermally conductive materially contacts a portion of the first thermally conductive material.

13. The method as recited in claim 11, wherein the first thermally conductive material serves as a gate of a heat generating device.

14. The method as recited in claim 11, wherein the heat generating devices are located within three thermal diffusion lengths of the first thermally conductive material.

15. The method as recited in claim 11, wherein the heat generating devices are fully depleted.

16. The method as recited in claim 11, wherein the heat generating devices are partially depleted.

17. The method as recited in claim 11, wherein the second thermally conductive material is added between adjacent heat generating devices.

18. The method as recited in claim 11, further comprising the step of adding a liner material within the trench isolation region that contacts the buried oxide and a top surface of the first thermally conductive material.

19. The method as recited in claim 11, wherein the isolation region is a trench isolation.

20. The method as recited in claim 11, wherein the isolation region is a MESA isolation.

21. The method as recited in claim 11, wherein the first thermally conductive material is a buried gate structure of a heat generating device.

22. A method of fabricating a semiconductor device having increased heat dissipation properties, said method including the steps of forming a recess in a substrate, filling said recess with a thermally conductive material to form a plug, forming active devices at a surface of said substrate adjacent said plug, applying an insulator layer over said active devices and said plug, and forming a thermally conductive path from said plug through said insulator layer to a surface of said insulator layer.

23. A method as recited in claim 22, including the further step of forming an insulator layer on an interior of said recess.

24. A method as recited in claim 23, including the further step of opening said insulator layer in said recess at a bottom of said recess.

25. A method as recited in claim 23, including the further steps, in sequence, of forming an opening in a polish stop layer on a surface of said substrate at an active device location, forming a gate oxide on said substrate and in said opening in said polish stop layer, performing said filling step, and planarizing material deposited in said filling step to said polish stop layer.

26. A method as recited in claim 24, including the further steps, in sequence, of forming an opening in a polish stop layer on a surface of said substrate at an active device location, forming a gate oxide on said substrate and in said opening in said polish stop layer, performing said filling step, and planarizing material deposited in said filling step to said polish stop layer.

* * * * *